(12) United States Patent
Burger et al.

(10) Patent No.: US 6,870,622 B2
(45) Date of Patent: Mar. 22, 2005

(54) METHOD AND DEVICE FOR MONITORING ELECTRIC COMPONENTS IN A PICK-AND-PLACE DEVICE FOR SUBSTRATES

(75) Inventors: Stefan Burger, Munich (DE); Rainer Duebel, Baldham (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/240,041

(22) PCT Filed: Mar. 14, 2001

(86) PCT No.: PCT/DE01/00964

§ 371 (c)(1),
(2), (4) Date: Sep. 27, 2002

(87) PCT Pub. No.: WO01/74127

PCT Pub. Date: Oct. 4, 2001

(65) Prior Publication Data

US 2003/0055528 A1 Mar. 20, 2003

(30) Foreign Application Priority Data

Mar. 28, 2000 (DE) .......................................... 100 15 271

(51) Int. Cl.$^7$ ............................................... G01B 11/00
(52) U.S. Cl. ...................................................... 356/401
(58) Field of Search ........................... 356/401; 355/53, 355/77; 34/574; 250/548

(56) References Cited

U.S. PATENT DOCUMENTS

| | | | |
|---|---|---|---|
| 4,683,373 A | | 7/1987 | Tupman |
| 4,900,939 A | * | 2/1990 | Aoyama ..................... 250/548 |
| 5,330,226 A | | 7/1994 | Gentry et al. |
| 5,482,314 A | | 1/1996 | Corrado et al. |
| 5,541,695 A | | 7/1996 | Teremy et al. |
| 5,585,625 A | | 12/1996 | Spies |
| 5,752,115 A | | 5/1998 | McIntyre et al. |
| 5,848,802 A | | 12/1998 | Breed et al. |
| 5,959,732 A | * | 9/1999 | Hara et al. ................... 356/500 |
| 5,960,562 A | * | 10/1999 | Nishida et al. ............... 34/574 |
| 6,027,138 A | | 2/2000 | Tanaka et al. |
| 6,331,885 B1 | * | 12/2001 | Nishi .......................... 355/53 |
| 6,452,288 B1 | | 9/2002 | Roth et al. |
| 6,577,382 B2 | * | 6/2003 | Kida et al. .................... 355/77 |

FOREIGN PATENT DOCUMENTS

| | | |
|---|---|---|
| DE | 39 03 501 A1 | 8/1989 |
| DE | 197 41 393 A1 | 3/1998 |
| DE | 197 57 595 A1 | 7/1999 |
| EP | 0 669 227 B1 | 8/1995 |
| EP | 0886465 | 12/1998 |
| EP | 1 031 477 A1 | 8/2000 |
| WO | WO 94/23974 | 10/1994 |
| WO | 9949713 | 9/1999 |
| WO | WO 99/54173 | 10/1999 |

* cited by examiner

Primary Examiner—John F. Niebling
Assistant Examiner—Andre' C. Stevenson
(74) Attorney, Agent, or Firm—Harness, Dickey & Pierce, P.L.C.

(57) ABSTRACT

A method and device are for monitoring electric components in a pick-and-place device for substrates. The underside of a pick-up is monitored by an optical scanner during the pick-up phase and during the placing phase of a component. A lift drive for the pick-up is provided with a position sensor that is linked with a control device. The scanner emits and receives a scanning beam oriented transversally to the direction of lift and is likewise coupled with the control device, thereby allowing monitoring of the underside of the pick-up in a direct time-related manner with the picking and placing of the component. The various lift positions are saved and compared when a threshold value of the received scanning beam is exceeded so that the inventive device also allows for a monitoring of the height of the component.

29 Claims, 2 Drawing Sheets

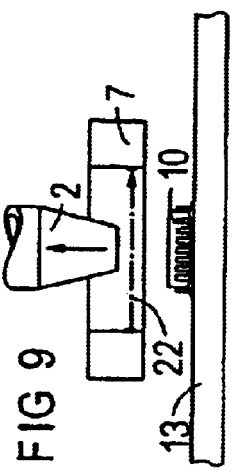
FIG 7
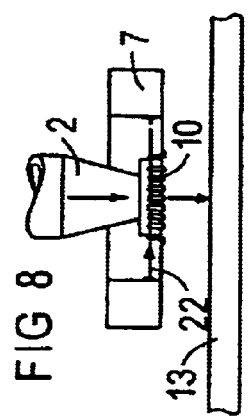
FIG 8
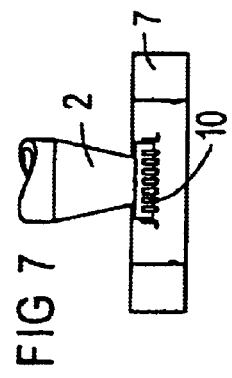
FIG 9
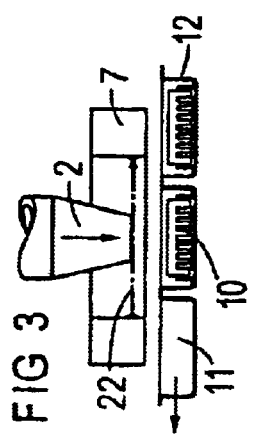
FIG 3
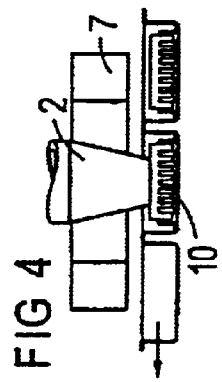
FIG 4
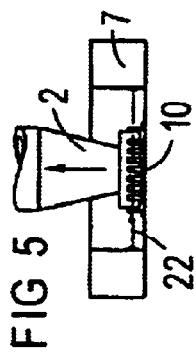
FIG 5
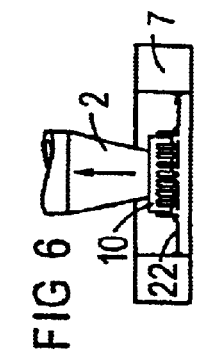
FIG 6
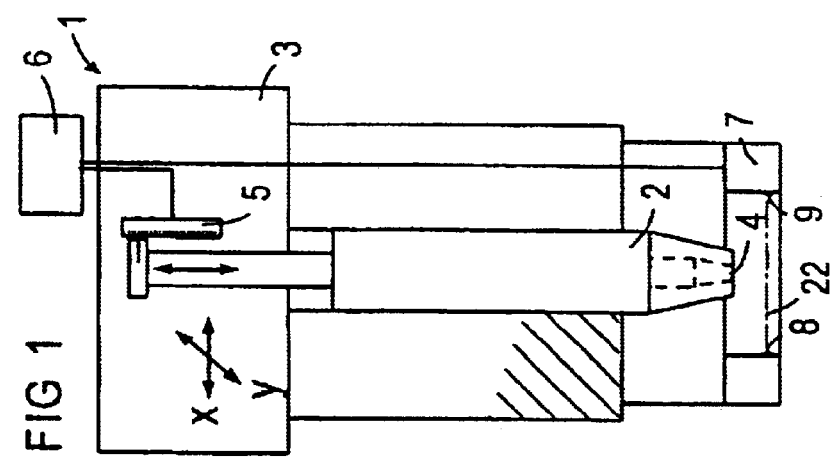
FIG 1
FIG 2

METHOD AND DEVICE FOR MONITORING ELECTRIC COMPONENTS IN A PICK-AND-PLACE DEVICE FOR SUBSTRATES

This application is the national phase under 35 U.S.C. § 371 of PCT International Application No. PCT/DE01/00964 which has an International filing date of Mar. 14, 2001, which designated the United States of America and which claims priority on German Patent Application number DE 100 15 271.6 filed Mar. 28, 2000, the entire contents of which are hereby incorporated herein by reference.

FIELD OF THE INVENTION

The invention generally relates to a method and a device for checking electric components in a pick-and-place device for substrates. Preferably, it relates to one wherein the components are handled by a pick-and-place head of the pick-and-place device which is made to travel in a working plane, with a pick-up for the components being displaced in the pick-and-place head perpendicularly in relation to the working plane via a lift drive between a transporting position and a functioning position. In the device, the component are preferably sucked against an underside of the pick-up, with the component being raised by the pick-up from a pick-up position into the transporting position and, after the pick-and-place head has been made to travel into a placement position, lowered onto the substrate into the functioning position. Finally, the positional relationship between the component and the pick-up is preferably checked by an optical scanning device of the pick-and-place head. The positional relationship is to be understood here as meaning not only the relative position of the components on the pick-up, but also the presence or absence of the component on the pick-up.

BACKGROUND OF THE INVENTION

A device of this type is disclosed by U.S. Pat. No. 5,660,519. According to the latter, the scanning device of the pick-and-place head in each case includes a row of transmitting and receiving diodes, which form a scanning plane perpendicular to the lifting direction at the height of the component located in the transporting position. While the pick-and-place head is traveling to the placement location on the substrate, the side contours of the component can be scanned by rotating the suction pick-up about the lifting axis, which allows the positional deviation of the center of the component from the pick-up axis to be ascertained. The presence or absence of the component on the pick-up is detected during the picking-up or placing of the component by sensing the suction pressure at the pipette. It goes without saying that the presence or absence of the component can also be established by optical measurement.

Furthermore, JP 11-154797 A discloses a pick-and-place device with a fixed turntable rotating step by step, under which a printed circuit board can be made to travel in two coordinate directions. The turret-like turntable is equipped with a multiplicity of pick-ups for the components, which run step by step through different stations and which transport the components from a pick-up position to an opposite placement position. Before the picking up, the free end of the pick-up runs through a control station with a perpendicular row of optical transmitting and receiving diodes in the manner of light barriers, whereby the position in height of the underside of the pick-up can be ascertained.

After the picking-up of the component, the end of the pick-up with the component runs through a further optical control station with a perpendicular row of diodes, whereby the position in height of the underside of the component, and consequently its overall height, can be ascertained. In the case of a pick-and-place head which can be made to travel in two coordinate directions, the pick-up would have to run through the fixed control station before and after picking up the component to allow a corresponding measurement to be carried out, which would generally involve an unacceptable detour between the pick-up position and the and the placement position, and vice versa.

Furthermore, it is known, for example from U.S. Pat. No. 4,875,285, to design the pick-and-place head in the manner of a turret with a multiplicity of suction pick-ups arranged in a circular manner on a rotor, a stator having with processing stations for the components arranged along the circulatory path of the pick-ups, which components are centered, contacted and electrically, optically or mechanically measured in these stations, for example according to column 2, line 65 et seq. It is currently generally customary to carry out the positional determination of the components on the pick-up by a CCT camera, which measures the placement side of the components, in particular the position of the contact areas, in reflected light. The angular position of the component can be corrected in a downstream rotating station. The x-y offset is taken into account by corresponding correction of the target coordinates of the pick-and-place head.

Furthermore, WO 9949713 A discloses a turret pick-and-place head with a stator and a rotor, which is provided with pick-ups for the components arranged in a circulatory manner. A line sensor is arranged on the stator outside a lower placement station between two holding stations for the pick-ups into the and aligned in relation to the axis of rotation of the rotor. The components sliding past, adhering to the pick-up, can be identified from the obscuration of the sensor. Since the pick-up has to be moved into the sensing range of the sensor, it cannot be checked in a direct time-related manner with the picking-up operation. Since the light directed onto the line sensor cannot be exactly focused, adequately sharp projection is not possible, in particular for highly miniaturized components. Sharp optical focusing is possible only in the case of a singular scanning beam, for example of a laser light barrier.

The current trend toward ever smaller components, of for example an edge length of 0.25 mm, requires a very narrow suction channel in the pick-up, which makes it difficult for the vacuum to be sensed, in particular when there is soiling. Furthermore, inaccuracies of the pick-up position may occur if the component does not completely cover the suction channel and, as a result of this leakage, the result of the vacuum scanning is unreliable. For example, in the case of a turret head, under some circumstances the absence of a component is consequently only noticed in the optics station during the placement phase. The picking up of a replacement component requires a considerable additional amount of time to be expended.

SUMMARY OF THE INVENTION

An embodiment of the invention may be based on an object of achieving a higher level of reliability in the checking of the components.

An optically precise focusable scanning beam, for example of a laser diode, may be arranged just underneath the underside of the pick-up in the raised state. This makes it possible to check the underside of the pick-up before it is lowered onto the component to be picked up. Normally, the path of rays of the light barrier is not interrupted. After that, the pick-up is lowered onto the component to be picked up. The latter is then sucked onto said pick-up and raised.

Directly after that, it can be reliably established by a renewed scanning pulse whether the component has been picked up by the pick-up. If there is exact focusing of the scanning beam, it is possible to keep the free distance between the transmitting device and receiving device particularly large. Thus, even extremely large components can be passed through and that the light barrier can be used for example even in a turret pick-and-place head, where it is not possible to get close to the component on account of the complex form of construction.

It is customary practice for the components to be supplied in belt pockets. When the belt is advanced, it may happen that vibrations cause the component to come out of the pocket or change its position, but it is also possible on account of the tolerances mentioned for the pick-up not to pick up the component. The directly following scanning can immediately initiate a new picking-up operation, in which the belt is advanced by a further pocket spacing, so that the pick-up can pick up another component. This takes place without any further traveling movement of the pick-and-place head and consequently with little time delay.

Directly before the component is placed onto the substrate, scanning may be carried out once again, in order to establish whether the component is still present on the pick-up. This is advantageous if the component is lost before it is placed, for example as a result of vibrations, accelerations or decelerations of the pick-and-place head. In this case, the setting down of the pick-up is not performed. This is of significance to the extent that otherwise the underside of the pick-up would be set down onto the soldering paste present on the printed circuit board, with the effect of contaminating the underside so much that the suction opening is considerably narrowed or even closed. If the component is present, it is placed onto the substrate and released from the underside by means of a pulse of compressed air. In the case of very small components, however, the adhesive action of a contaminated underside may be to so great that the component sticks to the pick-up. This is established by scanning directly after the raising of the pick-up, so that the pick-up can once again attempt to place the component onto the substrate before the pick-and-place head leaves the placement position. In this way, a high degree of picking and placing reliability is achieved.

Complete monitoring of the underside of the pipettes in all operating phases may also be achieved.

It is possible not only to check the presence of a component but also to ascertain the height of the component, allowing additional information to be obtained concerning the type of component. For example, it may happen that the component lying in the belt pocket is sucked against the pick-up one-sidedly, so that it is picked up on edge by the pick-up. With the aid of the exactly focused scanning beam, this can be detected already during picking-up as a pick-up error even in the case of the highly miniaturized components that are especially susceptible to this. Such a component is discarded in a specific position and consequently does not get onto the substrate in an undefined way. It is particularly advantageous to measure the tip of the pick-up in each case during the upward movement following the placement of a component and after the pick-up of the following component, since the hysteresis of the displacement-measuring system does not occur when the direction of movement is the same.

Further, the conditions on the underside of the pick-up can be completely monitored, so that the level of pick-and-place reliability is correspondingly increased.

In addition, more accurate checking of the component height in the lifting direction can be achieved, from which more accurate conclusions can be drawn concerning the type or the installation position of the component.

It is possible for the scanning device to be combined in a structure, whereby an exact geometrical relationship between the functional parts can be established. The deflecting device near the underside can be formed for example by a prism which deflects the scanning beam obliquely upward to a transmitting diode.

The turret pick-and-place head may include, for example, 12 suction pick-ups, which are arranged in a star-shaped manner along a circular circulatory path. The rotor is driven step by step, so that the suction pick-ups can be rotated one after the other into the pick-up station, in order to be able to pick up the components in a direct sequence. However, this means that, before they can be optically inspected, the components run through at least several stations, until they reach an optics station. In this period of time, it is not possible without the scanning device according to an embodiment of the invention for the components to be optically checked. Some of the components are only taken past the optics station and checked in the placement phase. As a result, pick-up errors which cannot be detected by the vacuum sensing are only detected in a later phase, and consequently entail a corresponding time loss.

An embodiment of the invention makes it possible to monitor all the suction pick-ups directly in connection with the picking-up operation, so that, in the event of a pick-up error, the pick-up can undertake a new pick-up attempt, without it being possible in the meantime for the rotor to be turned further. It is customary to arrange the optical station for measuring the component position several stations upstream of the placement station and to turn the pick-up into the desired installation position in a downstream station. During the turning of the rotor and the pick-up, it is still possible after the optical measurement for a component to be lost, which without the scanning means in the placement station could no longer be detected. The optical scanning during placement therefore increases the level of monitoring reliability to a considerable degree.

It is possible to make the cable light barrier engage in one piece from the stator side into the traveling path of the components.

BRIEF DESCRIPTION OF THE DRAWINGS

The invention is explained in more detail below on the basis of exemplary embodiments represented in a schematized form in the figures, wherein:

FIG. 1 shows a section through a pick-and-place head with a suction pick-up and a controller, FIG. 2 shows a plan view of part of the pick-and-place head according to FIG. 1, FIG. 3 shows part of the pick-and-place head at the beginning of a pick-up phase with a component belt and electric components, FIG. 4 shows the parts according to FIG. 3 in a subsequent phase, FIG. 5 shows the parts according to FIG. 4 without the component belt in a subsequent phase, FIG. 6 shows the parts according to FIG. 5 at the end of the pick-up phase, FIG. 7 shows the parts according to FIG. 6 after the end of the pick-up phase, FIG. 8 shows the parts according to FIG. 7 during a placement phase of the component onto a substrate, FIG. 9 shows the parts according to FIG. 9 after the placement of the component.

DETAILED DESCRIPTION OF THE PREFERRED EMBODIMENTS

Figure 11:
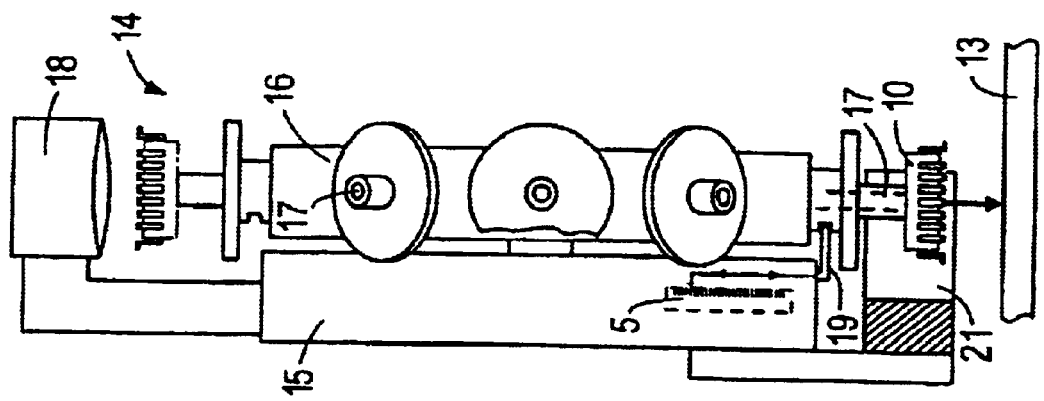
FIG. 11 shows a side view of the parts according to FIG. 10.

According to FIG. 1, a pick-and-place head 1 which can be made to travel in two coordinate directions X and Y of a horizontal working plane X-Y is provided with a pick-up 2, which is displaceable via its lift drive 3 perpendicularly in relation to the working plane. The pick-up 2 is provided on its downwardly pointing tip with a suction opening 4 for work pieces to be picked up. The lift drive 3 has a displacement-measuring device 5, with which the respective lifting position of the pick-up can be established and which is connected via a data line to a controller 6 of the pick-and-place device. In the region of the underside of the pick-up 2 there is fastened to the pick-and-place head 1 a scanning device 7 in the form of a forked light barrier, which is provided with a transmitting diode 8 and a receiving diode 9. The diodes are arranged and aligned with each other in such a way that a sharply focused scanning beam 22 running between them crosses the pick-up axis perpendicularly. The scanning device 7 is likewise connected to the controller 6 via a further data line.

In the transporting position shown, the pick-up 2 is in the uppermost lifting position, in which the underside of the pick-up 2 is located above the scanning height defined by the diodes. The controller 6 receives the measured displacement values of the displacement-measuring device 5. The scanning device is activated during the lowering and lifting phases of the pick-up 2. The signals received by the receiving diode are likewise transmitted to the controller 6. At the moment at which the received brightness value of the receiving diode 9 exceeds a threshold value, the lifting displacement just measured of the pick-up 2 is stored for further use.

FIG. 2 shows a plan view of the scanning device 7, with the position of the tip of the pick-up 2 and an electric component 10 to be held on it being indicated by dashed lines.

In FIGS. 3 to 9, the sequence of the phases of a picking-and-placing cycle with respect to the scanning device 7 is represented.

According to FIG. 3, the pick-and-place head is located with its pick-up 2 above a component 10 to be picked up and has already been lowered from its starting position, represented in FIG. 1, to the extent that its empty underside crosses the scanning beam 22 of the scanning device 7. The corresponding position of the pick-up is stored by the controller 6. It is possible to carry out such scanning after each change of pick-up and to compare the standard value ascertained in this way with the respective measured value when the empty pick-up is lowered. Significant deviations may then indicate an error at the tip of the pick-up, which for example suggests contaminants or a component sticking to it.

According to FIG. 4, the underside of the pick-up 2 is already resting on the component lying in a pocket 11 of a belt 12 and sucking this component onto it.

According to FIG. 5, the pick-up 2 has been raised to the extent that its underside is located above the scanning beam 22 and that the component 10 sucked onto it is interrupting the scanning beam 22. It is already possible at this moment to establish from the stored value that the component to be picked up is present on the pick-up 2.

According to FIG. 6, the pick-up 2 with the component 10 sucked onto it has just been raised to the extent that the underside of the component 10 clears the scanning beam 22. This change in status is detected by the controller 6 (FIG. 1), stored with the associated scanning value of the displacement-measuring device 5. At this moment, the value stored earlier can already be compared with the current value, the difference in height in the lifting position representing a measure of the height of the component 10. If the two scanned values remain unchanged, this indicates that the component 10 has not being sufficiently sucked onto the pick-up and raised. The controller 6 also knows the component data from a component library. A deviation in the height values may mean that an incorrect type of component has been provided or that the component was sucked onto the pick-up in an incorrect position. Such components can be removed over a discharge point. The unsuccessful attempt can trigger a renewed picking-up operation before the pick-up leaves the pick-up position.

According to FIG. 7, the pick-up 2 has been raised into its upper transporting position, in which the component 10 is located above the scanning height. The pick-and-place head 1 can now be made to travel into the placement position for the component 10.

According to FIG. 8, the pick-up 2 with the component 10 is located precisely in this placement position above a substrate 13 in the lowering phase. In this case, it can be checked in a way corresponding to FIG. 5 whether the component 10 is still on the pick-up. This check, which may also be combined with a renewed height measurement, permits a reliable statement concerning the presence of the component 10. If the latter has been lost during transport, the pick-up 2 is not lowered any further, so that its tip cannot be contaminated with soldering paste present on the substrate 13.

According to FIG. 9, the component 10 has already been placed onto the substrate 13 and the empty underside of the pick-up 2 has been raised above the scanning level. During this operation, the status of the receiving diode 9 is continuously monitored, so that it can be established whether the component has actually been released from the pick-up 2.

Figure 10:
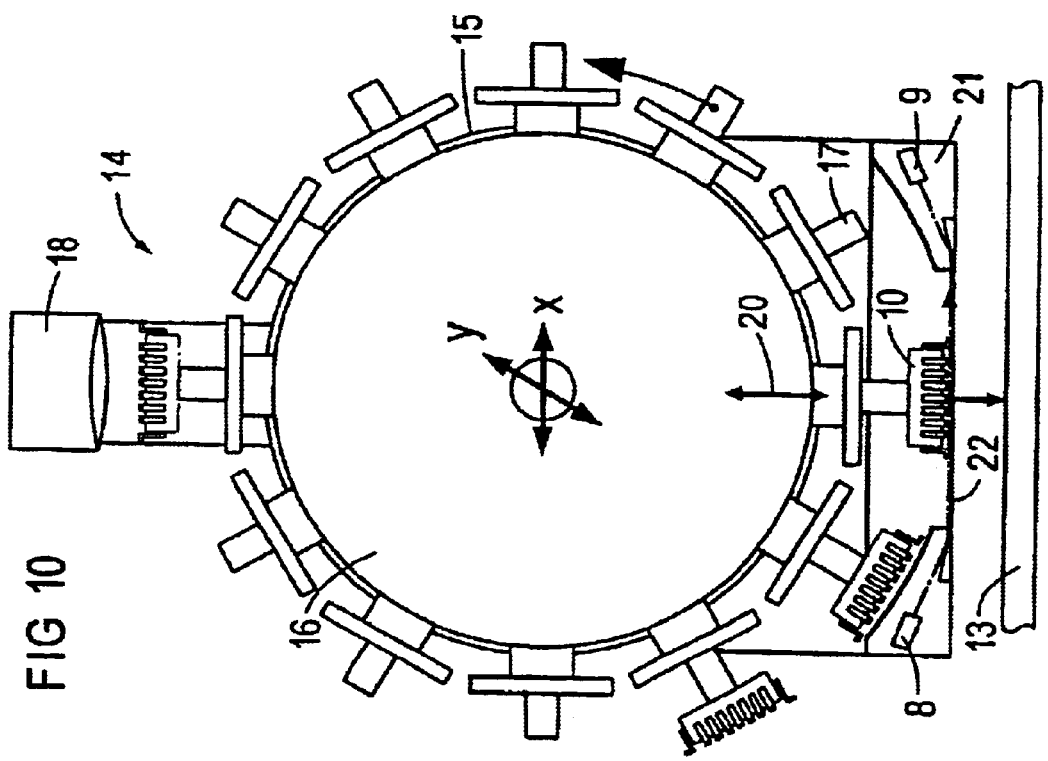
FIG. 10 shows a side view of another, turret-like pick-and-place head with components and a substrate.

According to FIGS. 9 and 10, another pick-and-place head 14 is designed in the manner of a turret and can be made to travel in the working plane in both coordinate directions x and y. It has a stator 15, on which a rotor 16 can be mounted such that it can rotate step by step. On the rotor, modified pick-ups 17 are arranged such that they protrude in a star-shaped manner and run around in a circular manner. During a picking cycle, in this way all the pick-ups 17 can be loaded with components one after the other in turn before the pick-and-place head travels over the substrate 13. Along the circulatory path of the pick-ups 17 there is an optical scanning unit 18, with which the underside of the components 10 can be accurately measured. This means that, without a scanning device, the presence and type of the component 10 can only be reliably checked in this phase. Consequently, an incorrect pick-up can only be corrected during the next picking cycle.

Another lift drive 19 with the displacement-measuring device 5 is assigned to a lifting station 20 and is in temporary engagement with the associated pick-up 17. Another scanning device 21 is fastened to the stator 15 in such a way that the scanning beam 22 is directed just above and tangentially in relation to the circulatory path of the components 10. By this arrangement it is possible to form the scanning device likewise as a forked light barrier with a one-piece bow-like carrier, the base of which is fastened to the stator 15 on one side of the circulatory path. It is also possible in the case of this pick-and-place head 14 for scanning steps corresponding to FIGS. 3 to 9 to be carried out.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A device for checking electric components, comprising:
    a pick-and-place head, travelable in a working plane and intended for handling the components, wherein a pick-up for the components is mounted in the pick-and-place head to be displaced perpendicularly in relation to the working plane via a lift drive between a transporting position and a functioning position, wherein a component is adapted to be sucked against the underside of the pick-up, raised by the pick-up from a pick-up position into the transporting position and, after the pick-and-place head travels into a placement position, lowered onto the substrate into the functioning position, the pick-and-place head including
    an optical scanning means for checking a component on the pick-up, and for receiving at least one scanning beam oriented transversely in relation to the lifting direction and narrow in the lifting direction, wherein, in the transporting position, the underside of the pick-up is located above the scanning beam, and
    control means for keeping a control check on the lifting movement of the pick-up, wherein the scanning means is coupled to the control means, the scanning means is adapted to be activated in a phase before and a phase after the suction attachment of the component, the control means is adapted to detect at least one of the presence and absence of the component on the pick-up from the scanning values of the scanning means, and the control means is adapted to assess scanning values remaining the same between the two phases as operating errors.

2. The device as claimed in claim 1, wherein, in the transporting port position of the component, the scanning beam is arranged under the underside of said component, in its functioning position, the underside of the pick-up is located underneath the sharply focused scanning beam, the lift drive includes a displacement-measuring means for determining the lifting position of the pick-up, the displacement-measuring means is coupled to the control means, the lifting means is adapted to be activated during at least one of the raising and lowering of the component, and the control means is adapted to ascertain the position in height of at least one of the underside of the component and of the pick-up from the changes in the scanning values during the crossing of the undersides and from the respective lifting position of the pick-up, and from this is adapted to calculate the height of the component.

3. The device as claimed in claim 2, wherein the scanning means is formed as a forked light barrier with a bow-shaped carrier for the optical functional parts, and wherein the scanning beam is arranged by deflecting means near the underside of the scanning means facing the substrate.

4. The device as claimed in claim 1, wherein the pick-and-place head is designed in the manner of a turret, and includes a stator, on which a rotor is mounted such that it can rotate step by step, wherein the rotor is provided with a multiplicity of pick-ups distributed in a circular manner, wherein the pick-up is adapted to be lowered and raised by the lift drive in a lifting station of the pick-and-place head, wherein the scanning means fastened to the stator is assigned to the lifting station, and wherein the stator of the pick-and-place head is provided outside the lifting station in addition to the scanning means, with an optics station for ascertaining the position of the component on the pick-up.

5. The device as claim ed in claim 4, wherein the scanning beam is oriented in the direction of rotation of the components.

6. The device as claimed in claim 2, wherein the pick-and-place head is designed in the manner of a turret, and includes a stator, on which a rotor is mounted such that it can rotate step by step, wherein the rotor is provided with a multiplicity of pick-ups distributed in a circular manner, wherein the pick-up is adapted to be lowered and raised by the lift drive in a lifting station of the pick-and-place head, wherein the scanning means fastened to the stator is assigned to the lifting station, and wherein the stator of the pick-and-place head is provided outside the lifting station in addition to the scanning means, with an optics station for ascertaining the position of the component on the pick-up.

7. The device as claimed in claim 6, wherein the scanning beam is oriented in the direction of rotation of the components.

8. The device as claimed in claim 3, wherein the pick-and-place head is designed in the manner of a turret, and includes a stator, on which a rotor is mounted such that it can rotate step by step, wherein the rotor is provided with a multiplicity of pick-ups distributed in a circular manner, wherein the pick-up is adapted to be lowered and raised by the lift drive in a lifting station of the pick-and-place head, wherein the scanning means fastened to the stator is assigned to the lifting station, and wherein the stator of the pick-and-place head is provided outside the lifting station in addition to the scanning means, with an optics station for ascertaining the position of the component on the pick-up.

9. The device as claimed in claim 8, wherein the scanning beam is oriented in the direction of rotation of the components.

10. A pick-and-place head for checking a component, comprising:
    an optical scanning means for receiving at least one scanning beam oriented transversely in relation to a direction of lifting the component and narrow in the lifting direction, wherein, in a transporting position, an underside of a pick-up device is located above the scanning beam, and
    control means for keeping a control check on the lifting movement of the pick-up device, wherein the scanning means is coupled to the control means, the scanning means is adapted to be activated in a phase before and a phase after suction attachment of the component, the control means is adapted to detect at least one of the presence and absence of the component when picked-up from the scanning values of the scanning means, and the control means is adapted to assess scanning values remaining the same between the two phases as operating errors.

11. The pick-and-place head of claim 10, wherein the pick-up device is mounted in the pick-and-place head.

12. A device for checking electric components, comprising the pick-and-place head of claim 10.

13. A device for checking electric components, comprising the pick-and-place head of claim 11.

14. The pick-and-place head of claim 10, wherein the pick-and-place head is travelable in a working plane and intended for handling the components.

15. The pick-and-place head of claim 11, wherein the pick-and-place head is travelable in a working plane and intended for handling the components.

16. The device as claimed in claim 10, wherein, in a transporting port position of the component, the scanning beam is arranged under the underside of the component, in its functioning position, the underside of the pick-up device is located underneath the sharply focused scanning beam, a lift drive device includes a displacement-measuring means for determining a lifting position of the picked-up component, the displacement-measuring means is coupled to the control means, the lifting means is adapted to be activated during at least one of the raising and lowering of the component, and the control means is adapted to ascertain the position in height of at least one of the underside of the component and of the picked-up component from the changes in the scanning values during the crossing of the undersides and from the respective lifting position of the picked-up component, and from this is adapted to calculate the height of the component.

17. The device as claimed in claim 16, wherein the scanning means is formed as a forked light barrier with a bow-shaped carrier for the optical functional parts, and wherein the scanning beam is arranged by deflecting means near the underside of the scanning means facing the substrate.

18. The device as claimed in claim 10, wherein the pick-and-place head is designed in the manner of a turret, and includes a stator, on which a rotor is mounted such that it can rotate step by step, wherein the rotor is provided with a multiplicity of pick-up devices distributed in a circular manner, wherein the pick-up devices are adapted to be lowered and raised by a lift drive in a lifting station of the pick-and-place head, wherein the scanning means fastened to the stator is assigned to the lifting station, and wherein the stator of the pick-and-place head is provided outside the lifting station in addition to the scanning means, with an optics station for ascertaining the position of the component on the pick-up.

19. The device as claimed in claim 18, wherein the scanning beam is oriented in the direction of rotation of the components.

20. A pick-and-place head for checking a component, comprising:
an optical scanner, adapted to receive at least one scanning beam oriented transversely in relation to a direction of lifting the component and narrow in the lifting direction, wherein, in a transporting position, an underside of a pick-up device is located above the scanning beam, and
a controller, adapted to keep a control check on the lifting movement of the pick-up device, wherein the scanner is coupled to the controller, the scanner is adapted to be activated in a phase before and a phase after suction attachment of the component, the controller is adapted to detect at least one of the presence and absence of the component when picked-up from the scanning values of the scanner, and the controller is adapted to assess scanning values remaining the same between the two phases as operating errors.

21. The pick-and-place head of claim 16, wherein the pick-up device is mounted in the pick-and-place head.

22. A device for checking electric components, comprising the pick-and-place head of claim 16.

23. A device for checking electric components, comprising the pick-and-place head of claim 17.

24. The pick-and-place head of claim 16, wherein the pick-and-place head is travelable in a working plane and intended for handling the components.

25. The pick-and-place head of claim 17, wherein the pick-and-place head is travelable in a working plane and intended for handling the components.

26. The device as claimed in claim 20, wherein, in a transporting port position of the component, the scanning beam is arranged under the underside of the component, in its functioning position, the underside of the pick-up device is located underneath the sharply focused scanning beam, a lift drive device includes a displacement-measuring means for determining a lifting position of the picked-up component, the displacement-measuring means is coupled to the controller, the lifting means is adapted to be activated during at least one of the raising and lowering of the component, and the controller is adapted to ascertain the position in height of at least one of the underside of the component and of the picked-up component from the changes in the scanning values during the crossing of the undersides and from the respective lifting position of the picked-up component, and from this is adapted to calculate the height of the component.

27. The device as claimed in claim 26, wherein the scanner is formed as a forked light barrier with a bow-shaped carrier for the optical functional parts, and wherein the scanning beam is arranged by deflecting means near the underside of the scanning means facing the substrate.

28. The device as claimed in claim 20, wherein the pick-and-place head is designed in the manner of a turret, and includes a stator, on which a rotor is mounted such that it can rotate step by step, wherein the rotor is provided with a multiplicity of pick-up devices distributed in a circular manner, wherein the pick-up devices are adapted to be lowered and raised by a lift drive in a lifting station of the pick-and-place head, wherein the scanner fastened to the stator is assigned to the lifting station, and wherein the stator of the pick-and-place head is provided outside the lifting station in addition to the scanner, with an optics station for ascertaining the position of the component on the pick-up.

29. The device as claimed in claim 28, wherein the scanning beam is oriented in the direction of rotation of the components.

* * * * *